(12) United States Patent
Dariavach et al.

(10) Patent No.: US 8,780,542 B1
(45) Date of Patent: Jul. 15, 2014

(54) SYSTEM AND METHOD FOR GENERATING ELECTRICITY FROM COMPONENT WASTE HEAT

(75) Inventors: Nader G. Dariavach, Middleboro, MA (US); Michael John Kozel, Upton, MA (US); Jin Liang, Southborough, MA (US)

(73) Assignee: EMC Corporation, Hopkinton, MA (US)

( * ) Notice: Subject to any disclaimer, the term of this patent is extended or adjusted under 35 U.S.C. 154(b) by 5 days.

(21) Appl. No.: 13/436,907

(22) Filed: Mar. 31, 2012

(51) Int. Cl.
*H05K 7/20* (2006.01)

(52) U.S. Cl.
USPC ........................................ 361/679.1; 290/1 R

(58) Field of Classification Search
USPC .......................................................... 290/1 R
See application file for complete search history.

(56) References Cited

U.S. PATENT DOCUMENTS

| | | | |
|---|---|---|---|
| 4,924,677 A | | 5/1990 | Quack |
| 5,617,738 A | * | 4/1997 | Ikegami et al. ................. 62/509 |
| 6,751,959 B1 | * | 6/2004 | McClanahan et al. .......... 60/670 |
| 7,140,197 B2 | | 11/2006 | Chorida et al. |
| 7,200,005 B2 | * | 4/2007 | Von Gutfeld et al. ......... 361/695 |
| 7,525,207 B2 | | 4/2009 | Clidaras et al. |
| 8,223,495 B1 | | 7/2012 | Carlson et al. |
| 2003/0155106 A1 | * | 8/2003 | Malone et al. ................. 165/121 |
| 2003/0221446 A1 | | 12/2003 | Chordia et al. |
| 2003/0227757 A1 | * | 12/2003 | Vincent et al. ................ 361/796 |
| 2007/0007771 A1 | | 1/2007 | Biddle et al. |
| 2007/0040263 A1 | | 2/2007 | Towada |
| 2007/0281639 A1 | | 12/2007 | Clidaras et al. |
| 2008/0029250 A1 | | 2/2008 | Carlson et al. |
| 2009/0072624 A1 | | 3/2009 | Towada |
| 2009/0107536 A1 | * | 4/2009 | Sicuranza ..................... 136/205 |
| 2009/0114370 A1 | | 5/2009 | Konig |
| 2009/0277400 A1 | * | 11/2009 | Conry ................................ 123/2 |
| 2010/0146996 A1 | | 6/2010 | Campbell et al. |
| 2011/0146315 A1 | | 6/2011 | Zakrzewski |
| 2011/0247348 A1 | | 10/2011 | Mashiko et al. |
| 2012/0169067 A1 | * | 7/2012 | Ruan et al. .................... 290/1 R |
| 2013/0038055 A1 | * | 2/2013 | Ostrom et al. .................... 290/2 |
| 2013/0163193 A1 | * | 6/2013 | Ballantine et al. ....... 361/679.47 |

FOREIGN PATENT DOCUMENTS

DE 102009060887 A1 7/2011

* cited by examiner

*Primary Examiner* — Joseph Waks
(74) *Attorney, Agent, or Firm* — Brian J. Colandreo; Mark H. Whittenberger; Holland & Knight LLP

(57) ABSTRACT

An electrical energy generation device includes an energy conversion device thermally coupled to an electrical component and configured to convert thermal energy produced by the electrical component to mechanical motion. An electricity generation device is coupled to the energy conversion device and is configured to convert the mechanical motion to electrical energy. At least a portion of the electrical energy energizes the electrical component.

16 Claims, 2 Drawing Sheets

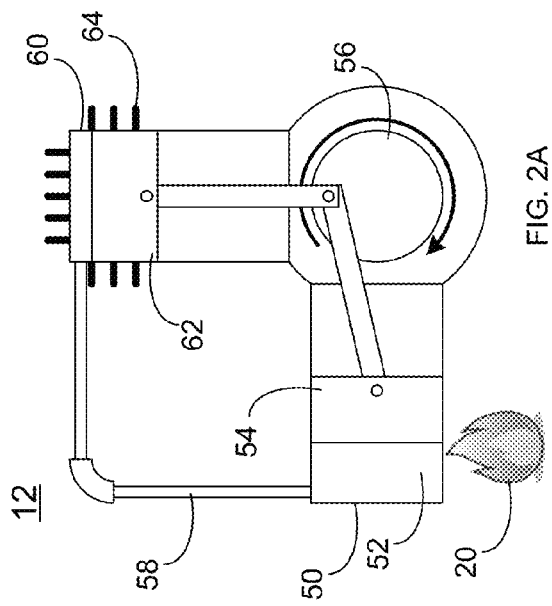
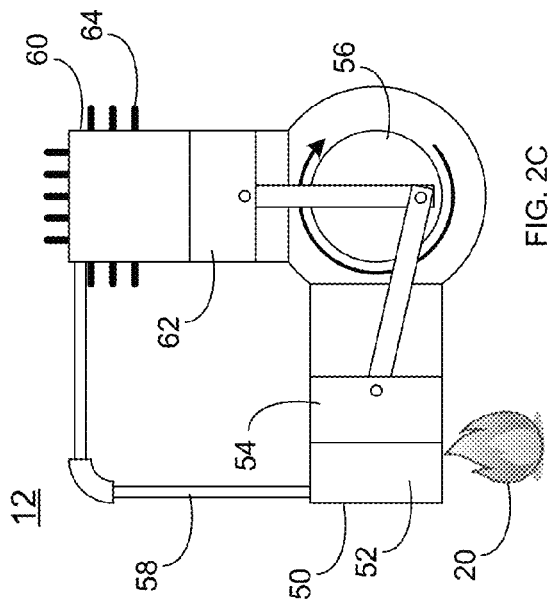
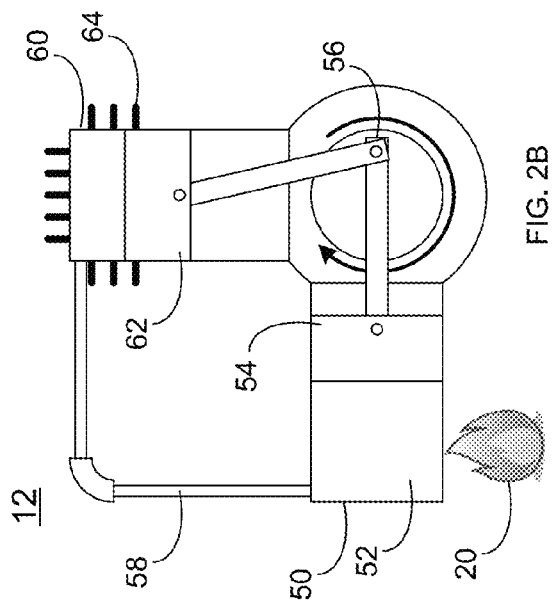
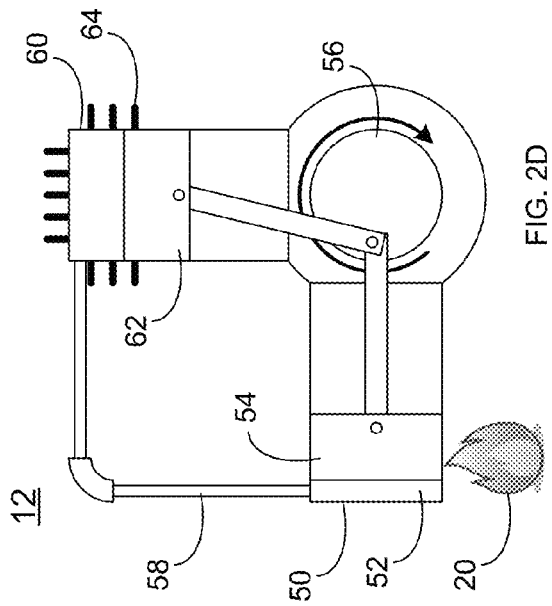

SYSTEM AND METHOD FOR GENERATING ELECTRICITY FROM COMPONENT WASTE HEAT

TECHNICAL FIELD

This disclosure relates to generating electricity and, more particularly, to generating electricity by converting waste heat.

BACKGROUND

As electronic components become more powerful, the amount of thermal energy these components generate greatly increases. Accordingly, various devices (e.g. heat sinks and cooling fans) are utilized to dissipate such thermal energy. Unfortunately, while such devices may dissipate such thermal energy, this energy is wasted and simply exhausted into the surrounding environment. This problem is further complicated when numerous computing devices (e.g. servers) are placed into a common environment (e.g. a server room), wherein a considerable amount of thermal energy is generated and more complex thermal management systems (e.g. refrigeration systems, air circulation and exhaust systems) are utilized to thermally manage such a common environment.

SUMMARY OF DISCLOSURE

In a first implementation, an electrical energy generation device includes an energy conversion device thermally coupled to an electrical component and configured to convert thermal energy produced by the electrical component to mechanical motion. An electricity generation device is coupled to the energy conversion device and is configured to convert the mechanical motion to electrical energy. At least a portion of the electrical energy energizes the electrical component.

One or more of the following features may be included. The energy conversion device may include a Stirling engine. The electricity generation device may include a generator. The electrical component may include a processing system. The electrical component may be configured to be coupled to a printed circuit board. The printed circuit board may be configured to be powered by a power supply system. An electrical coupling system may electrically couple an output of the electricity generation device to the printed circuit board, thus allowing for at least a portion of the electrical energy to be provided to the electrical component.

In another implementation, a processing system includes a microprocessor. An energy conversion device is thermally coupled to the microprocessor and configured to convert thermal energy produced by the microprocessor to mechanical motion. An electricity generation device is coupled to the energy conversion device and configured to convert the mechanical motion to electrical energy. At least a portion of the electrical energy energizes the microprocessor.

One or more of the following features may be included. The energy conversion device may include a Stirling engine. The electricity generation device may include a generator. The microprocessor may be configured to be coupled to a printed circuit board. The printed circuit board may be configured to be powered by a power supply system. An electrical coupling system may electrically couple an output of the electricity generation device to the printed circuit board, thus allowing for at least a portion of the electrical energy to be provided to the microprocessor.

In another implementation, an electrical energy generation device includes an energy conversion device, including a Stirling engine, thermally coupled to an electrical component and configured to convert thermal energy produced by the electrical component to mechanical motion. An electricity generation device is coupled to the energy conversion device and configured to convert the mechanical motion to electrical energy. At least a portion of the electrical energy energizes the electrical component.

One or more of the following features may be included. The electricity generation device may include a generator. The electrical component may include a processing system. The electrical component may be configured to be coupled to a printed circuit board. The printed circuit board may be is configured to be powered by a power supply system. An electrical coupling system may electrically couple an output of the electricity generation device to the printed circuit board, thus allowing for at least a portion of the electrical energy to be provided to the electrical component.

The details of one or more implementations are set forth in the accompanying drawings and the description below. Other features and advantages will become apparent from the description, the drawings, and the claims.

BRIEF DESCRIPTION OF THE DRAWINGS

FIGS. 2A-2D are diagrammatic views of the various operating phases of an energy conversion device included within the electrical energy generation device of FIG. 1.

Like reference symbols in the various drawings indicate like elements.

DETAILED DESCRIPTION

Figure 1:
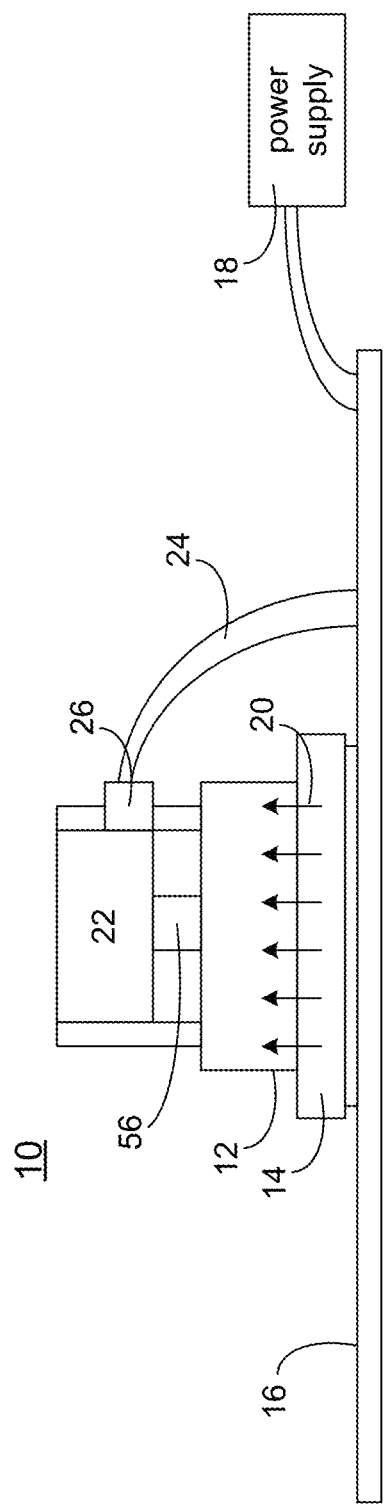
FIG. 1 is a diagrammatic view of an electrical energy generation device.

Referring to FIG. 1, there is shown electrical energy generation device 10, which may include energy conversion device 12 that may be thermally coupled to electrical component 14. Examples of electrical component 14 may include but are not limited to a microprocessor (e.g. a single microprocessor), a processing system (e.g. one or more microprocessors and additional componentry), a memory system (e.g. DRAM storage, flash storage), a controller system (e.g. a memory controller, a hard drive controller, a network controller), or any other electrical component that generates thermal energy.

Electrical component 14 may be configured to be coupled to printed circuit board 16. Examples of printed circuit board 16 may include but are not limited to a motherboard, a processor board, a daughter board or an expansion card. Printed circuit board 16 may be configured to be powered by power supply system 18. For example, power supply 18 may be configured to convert standard 110 volt AC voltage to one or more DC voltage levels (e.g. 12 Volts and/or 5 Volts) to power the various components included within/coupled to printed circuit board 16 (including electrical component 14).

As is known in the art, the above-described electrical components (e.g. electrical component 14) generates thermal energy 20 (commonly referred to as waste heat) during normal operation, due to inherent inefficiencies in electrical component 14. Energy conversion device 12 may be configured to convert thermal energy 20 produced by electrical component 14 to mechanical motion.

One example of energy conversion device 12 may include a Stirling engine. As is known in the art, a Stirling engine may be commonly referred to as a heat engine in which repeated expansion and compression of a working gas (e.g., air, helium or hydrogen) may convert thermal energy 20 into mechanical motion. Stirling engines may be classified as an external combustion engine, in that combustion does not occur within the cylinder(s) of the Stirling engine and an external heat source (e.g., thermal energy 20) may be used to heat one or more these cylinders of the Stirling engine. Stirling engines are closed systems, wherein a working gas (e.g., air, helium or hydrogen) is alternately heated and cooled by shifting the gas to different temperature locations within the Stirling engine.

In a two-cylinder (e.g., alpha configured) Stirling engine, one cylinder is kept warm (e.g., via an external heat source) and the other cylinder is kept cool. The Stirling engine may be thought of as having four different phases, namely Expansion phase, Transfer 1 phase, Contraction phase, and Transfer 2 phase. Referring also to FIGS. 2A-2D, the four phases of Stirling engine are shown.

EXPANSION PHASE (the transition from FIG. 2A to FIG. 2B): In the expansion phase, thermal energy 20 from an external heat source (e.g. electrical component 14) may be used to heat warm cylinder 50. The gas 52 within warm cylinder 50 may then expand. Expanding gas 52 may force warm piston 54 to the right (in this example). As warm piston 54 moves to the right, crankshaft 56 may be rotated (in this example) in a clockwise rotation.

TRANSFER 1 PHASE (the transition from FIG. 2B to FIG. 2C): As gas 52 continues to expand (e.g. up to three times its initial volume), a portion of this expanded gas may travel through transfer tube 58 and may enter cool cylinder 60. As expanding gas 52 travels through transfer tube 58 and enters cool cylinder 60, cool piston 62 may be driven downward (in this example), assisting in the rotation of crankshaft 56 in a clockwise direction.

CONTRACTION PHASE (the transition from FIG. 2C to FIG. 2D): During the contraction phase, the majority of expanded gas 52 has been transferred to cool cylinder 60. Cool cylinder 60 may be cooled via one or more cooling fins 64. Once within cool cylinder 60, the expanded gas may contract, thus allowing for crankshaft 56 to continue rotating clockwise (in this example) and cool piston 62 to move upward (in this example).

TRANSFER 2 PHASE (the transition from FIG. 2D to FIG. 2A): During Transfer 2 Phase, the gas within cool cylinder 60 has further contracted, thus allowing cool piston 62 to move further upward. Accordingly, contracted and cooled gas is transferred via transfer tube 58 to warm cylinder 50 so that it may be heated and expanded during the above-described expansion phase.

Crankshaft 56 of energy conversion device 12 may be coupled to electricity generation device 22 and may be configured to convert mechanical motion (e.g., the clockwise rotation of crankshaft 56) to electrical energy. One example of electricity generation device 20 may include but is not limited to a generator (e.g., a permanent magnet synchronous generator). Electricity generation device 22 may generate electrical energy, such that at least a portion of the electrical energy generated by electricity generation device 22 is provided to and energizes electrical component 14. For example, electricity generation by 22 may be configured to generate a 12 Volt DC voltage signal that may be used to at least partially energize electrical component 14.

Electrical coupling system 24 may electrically couple output 26 of electricity generation device 22 to printed circuit board 16, thus allowing for at least a portion of the electrical energy generated by electricity generation device 20 to be provided to electrical component 14.

Having thus described the disclosure of the present application in detail and by reference to embodiments thereof, it will be apparent that modifications and variations are possible without departing from the scope of the disclosure defined in the appended claims.

What is claimed is:

1. An electrical energy generation device comprising:
   an energy conversion device thermally coupled to an electrical component and configured to convert thermal energy produced by the electrical component to mechanical motion, wherein the electrical component is configured to be coupled to a printed circuit board;
   an electricity generation device coupled to the energy conversion device and configured to convert the mechanical motion to electrical energy, wherein at least a portion of the electrical energy energizes the electrical component; and
   an electrical coupling system for electrically coupling an output of the electricity generation device to the printed circuit board, allowing for at least a portion of the electrical energy to be provided to the electrical component.

2. The electrical energy generation device of claim 1 wherein the energy conversion device includes a Stirling engine.

3. The electrical energy generation device of claim 1 wherein the electricity generation device includes a generator.

4. The electrical energy generation device of claim 1 wherein the electrical component includes a processing system.

5. The electrical energy generation device of claim 1 wherein the printed circuit board is configured to be powered by a power supply system.

6. The electrical energy generation device of claim 1 wherein the energy conversion device includes a crankshaft coupled to the electricity generation device.

7. A processing system comprising:
   a microprocessor;
   an energy conversion device thermally coupled to the microprocessor and configured to convert thermal energy produced by the microprocessor to mechanical motion, wherein the electrical component is configured to be coupled to a printed circuit board;
   an electricity generation device coupled to the energy conversion device and configured to convert the mechanical motion to electrical energy, wherein at least a portion of the electrical energy energizes the microprocessor; and
   an electrical coupling system for electrically coupling an output of the electricity generation device to the printed circuit board, allowing for at least a portion of the electrical energy to be provided to the microprocessor.

8. The processing system of claim 7 wherein the energy conversion device includes a Stirling engine.

9. The processing system of claim 7 wherein the electricity generation device includes a generator.

10. The processing system of claim 7 wherein the printed circuit board is configured to be powered by a power supply system.

11. The processing system of claim 7 wherein the energy conversion device includes a crankshaft coupled to the electricity generation device.

12. An electrical energy generation device comprising:
   an energy conversion device, including a Stirling engine, thermally coupled to an electrical component and configured to convert thermal energy produced by the electrical component to mechanical motion, wherein the electrical component is configured to be coupled to a printed circuit board;

an electricity generation device coupled to the energy conversion device and configured to convert the mechanical motion to electrical energy, wherein at least a portion of the electrical energy energizes the electrical component; and an electrical coupling system for electrically coupling an output of the electricity generation device to the printed circuit board, allowing for at least a portion of the electrical energy to be provided to the electrical component.

13. The electrical energy generation device of claim 12 wherein the electricity generation device includes a generator.

14. The electrical energy generation device of claim 12 wherein the electrical component includes a processing system.

15. The electrical energy generation device of claim 12 wherein the printed circuit board is configured to be powered by a power supply system.

16. The electrical energy generation device of claim 12 wherein the energy conversion device includes a crankshaft coupled to the electricity generation device.

* * * * *